United States Patent
Chuang

(10) Patent No.: US 6,520,476 B1
(45) Date of Patent: Feb. 18, 2003

(54) SPINDLE POSITIONING SUPPORT STRUCTURE

(76) Inventor: Wen-Hao Chuang, No. 150, Lane 250, Kung-Yeh 2nd Rd., Lin-Yuan Hsiang, Kaohsiung Hsien (TW)

( * ) Notice: Subject to any disclaimer, the term of this patent is extended or adjusted under 35 U.S.C. 154(b) by 0 days.

(21) Appl. No.: 10/042,215

(22) Filed: Jan. 11, 2002

(51) Int. Cl.$^7$ ................................................ A47G 29/00
(52) U.S. Cl. ........................ 248/694; 384/246; 384/903
(58) Field of Search ............................ 248/694, 346.01, 248/346.04; 384/246, 903, 244, 420

(56) References Cited

U.S. PATENT DOCUMENTS

| | | | | |
|---|---|---|---|---|
| 3,913,200 A | * | 10/1975 | Kossor | ........................ 116/200 |
| 6,045,087 A | * | 4/2000 | Vislocky et al. | ......... 242/608.2 |
| 6,352,473 B1 | * | 3/2002 | Clark | ........................... 454/18 |
| 6,406,185 B1 | * | 6/2002 | Lin | ............................. 384/246 |

* cited by examiner

Primary Examiner—Anita King
Assistant Examiner—A. Joseph Wujciak, III
(74) Attorney, Agent, or Firm—Birch, Stewart, Kolasch & Birch, LLP

(57) ABSTRACT

A spindle positioning support structure includes a support body housed in a center opening of an air fan seat. The support body has an arched trough which has same profile as the bottom end of an air fan spindle. The arched trough has a top end formed a plurality of arched latch lips. Every two latch lips are spaced by a slot. Therefore the latch lips are extensible according to the diameter of the air fan spindle, and may couple with an indented annular groove formed on the peripheral rim of the air fan spindle thereby to allow the air fan spindle anchoring at a restricted center of the aid fan seat for positioning the air fan spindle accurately. The arched trough also may contain lube oil to reduce rotational friction of the air fan spindle.

3 Claims, 4 Drawing Sheets

SPINDLE POSITIONING SUPPORT STRUCTURE

FIELD OF THE INVENTION

The present invention relates to a spindle positioning support structure and particularly a spindle positioning support structure for an air fan of a central processing unit.

BACKGROUND OF THE INVENTION

Conventional methods for anchoring and positioning the spindle of the air fan of a central processing unit (CPU) usually are done by directly inserting the spindle into a center aperture of an air fan seat. As there is no spindle calibration after the spindle was installed, when the air fan rotates, the spindle tends to incur deviations and might result in shorter service life of the air fan or even cause air fan damage.

SUMMARY OF THE INVENTION

In view of the foregoing disadvantages, the primary object of the invention is to provide a spindle positioning support structure that has a support body which has extensible latch lips formed on the top end thereof to engage with an indented annular groove formed on the peripheral rim of the air fan spindle such that the air fan spindle will be directly anchored to a restrictive position without incurring deviations when the air fan rotates.

The support body of the invention is housed in a center opening of an air fan seat. The support body has an arched trough which has a profile same as the bottom end of the air fan spindle. The arched trough has a top end extending upwards to form arched latch lips. Every two latch lips are spaced by a slot. Furthermore, the bottom end of the arched trough may have a trough aperture formed in a trapezoid shape with a wider upper end and a narrower lower end for holding a rolling ball to slide up and down inside.

By means of the construction set forth above, the invention may achieve the following advantages:

1. The extensible latch lips at the top end of the support body make coupling and positioning of the spindle in the air fan seat more accurate.
2. The slots between the latch lips at the top end of the support body allow the latch lips extending and contracting easier, and allow the spindle to engage with the center opening of the air fan seat at the restrictive position.
3. The support body of the invention can provide more secure support function to the air fan spindle when coupling in the air fan seat, and may result in smoother air fan rotation without incurring spindle deviations.
4. According to the invention, a sensor may be deployed on an inner bottom rim of the air fan seat to detect spindle deviations during rotation, and immediately reports sensing conditions to prevent the air fan from damaging.
5. The arched trough of the support body has same profile as the bottom end of the air fan spindle, and may hold lube oil inside to allow the spindle rotating more smoothly.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 2:
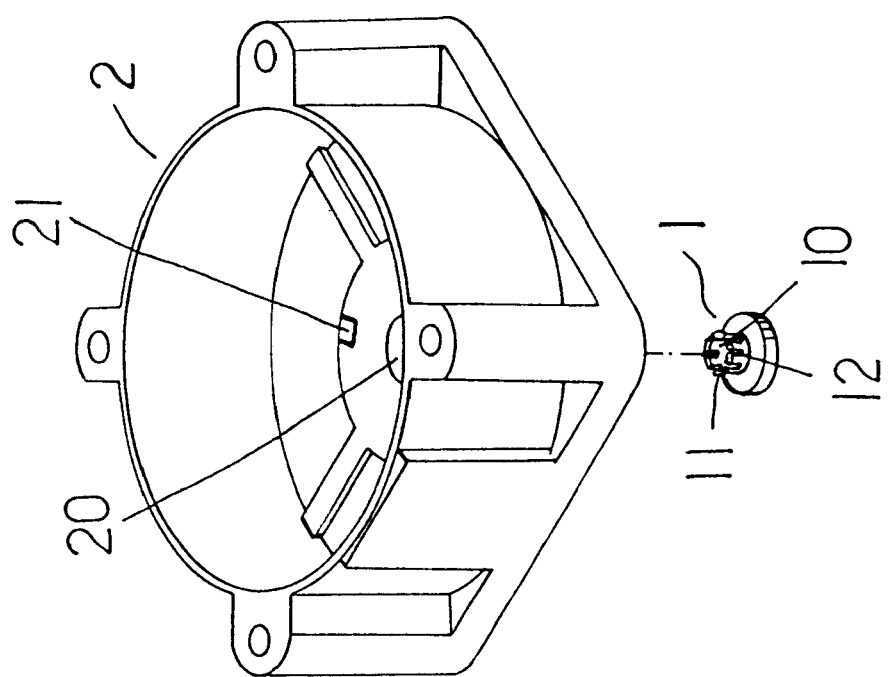
FIG. 2 is an exploded view of the invention, showing the support body and an air fan seat.
Figure 1:
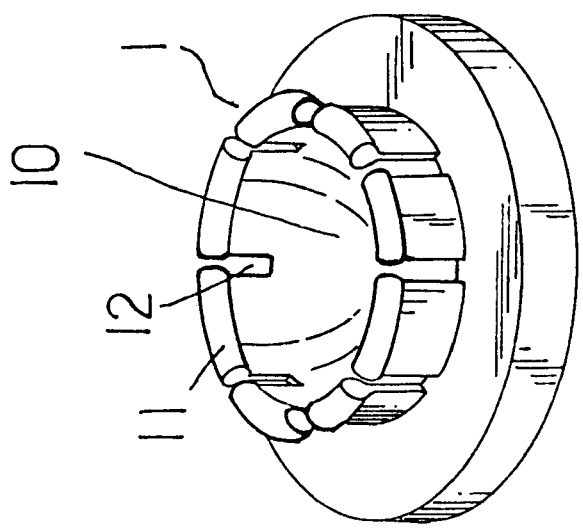
FIG. 1 is a perspective view of the support body of the invention.

Referring to FIGS. 1 and 2, the support body 1 of the invention is held in a center opening 20 of an air fan seat 2. The support body 1 has an arched trough 10 formed therein matching the profile of a bottom end 30 of an air fan spindle 3. The arched trough 10 has a top end extending upwards and forming arched latch lips 11. There is a slot 12 formed between every two neighboring latch lips 11. Hence the latch lips 11 become extensible. On an inner bottom rim of the air fan seat 2, there is a sensor 21 located thereon for detecting deviations incurred to the air fan spindle 3 during rotation. When a spindle deviation is detected, the sensor will send an alert immediately to prevent the air fan from damaging.

Figure 3:
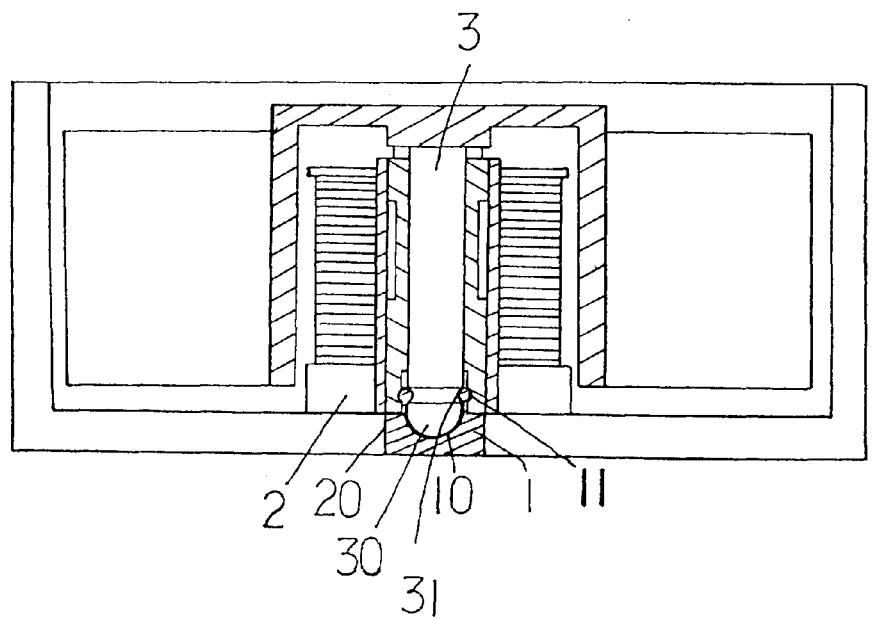
FIG. 3 is a schematic view of the invention, showing an assembled condition.
Figure 4:
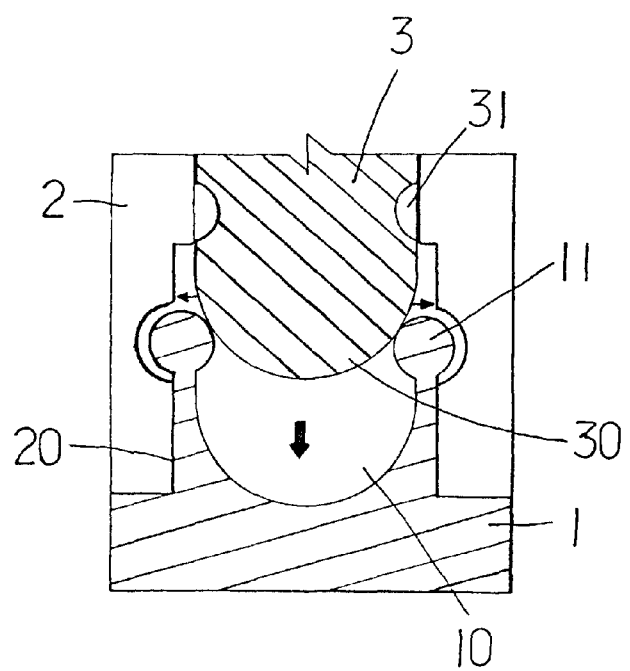
FIG. 4 is a schematic view of the invention, showing the air fan spindle not yet coupling with the support body.
Figure 5:
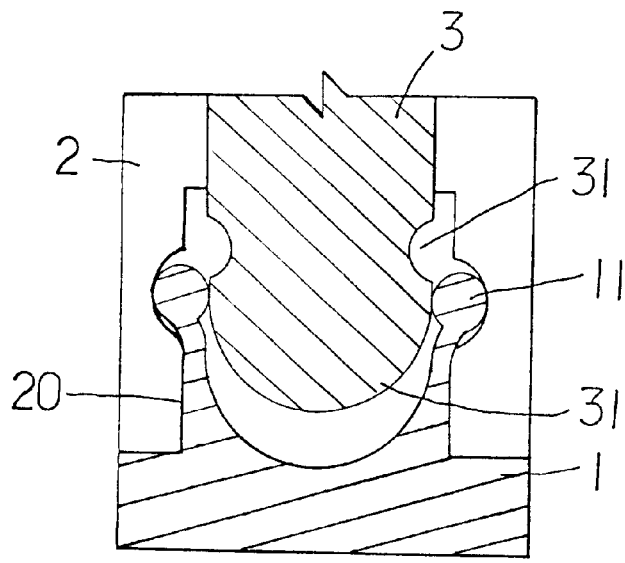
FIG. 5 is a schematic view of the invention, showing the air fan spindle is coupling with the support body.
Figure 6:
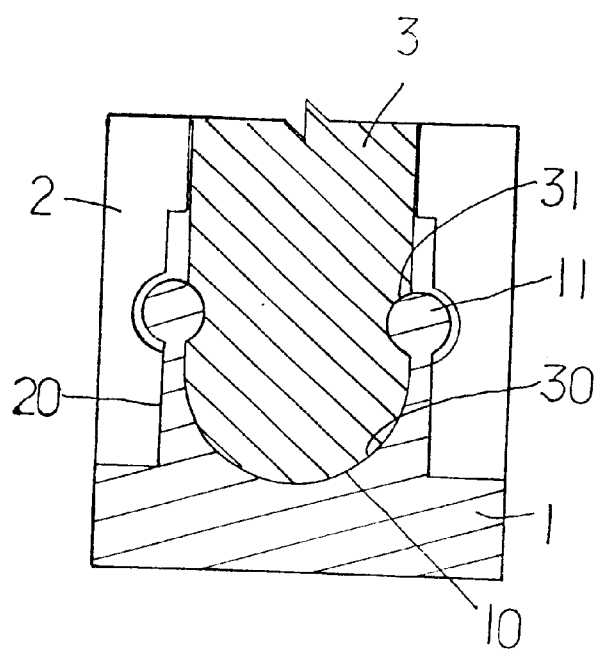
FIG. 6 is a schematic view of the invention, showing the air fan spindle is coupled with the support body.

Referring to FIG. 3 for assembly of the invention, when the bottom end 30 of the air fan spindle 3 is thrust into the arched trough 10 of the support body 1 located in the center of the air fan seat 2, the bottom end 30 of the spindle 3 pushes the latch lips 11 outwards to allow the bottom end 30 of the spindle 30 entering into the arched trough 10. And the latched lips 11 are coupled to an indented annular groove 31 formed on the peripheral surface of the air fan spindle 3 (as shown in FIGS. 4, 5, and 6). Hence the air fan spindle 3 may be anchored and positioned in the air fan seat 2 accurately. Moreover, the arched trough 10 may contain lube oil to allow the air fan spindle 3 rotating more smoothly with better lubrication.

Figure 7:
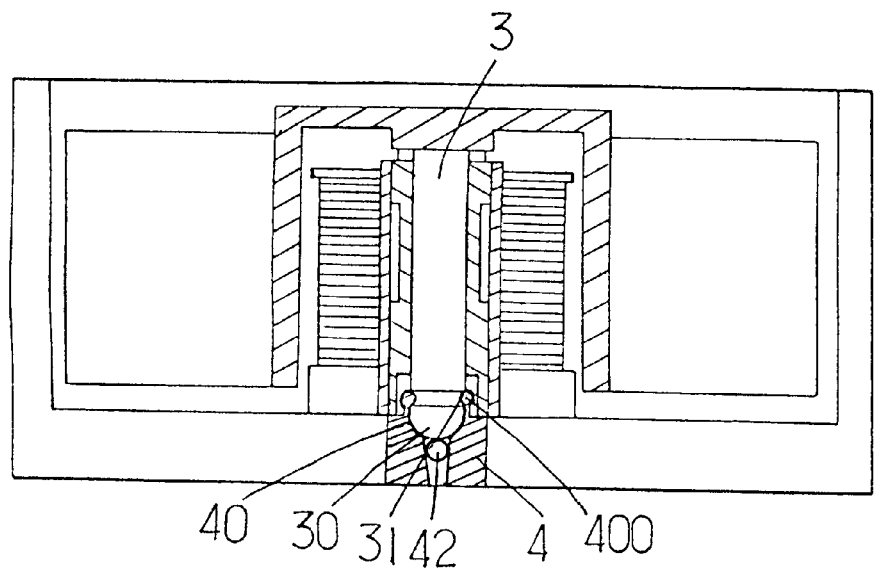
FIG. 7 is a schematic view of another embodiment of the invention, showing an assembled condition.
Figure 8:
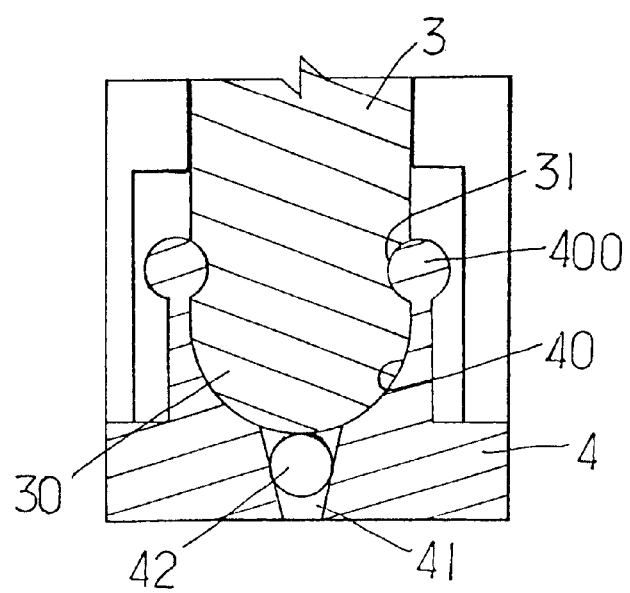
FIG. 8 is a fragmentary enlarged cross section of FIG. 7.

Referring to FIGS. 7 and 8 for another embodiment of the invention, the support body 4 has an arched trough 40 formed therein. The arched trough 40 has a top end extending upwards and forming arched latch lips 400. The arched trough 40 has a bottom end, which has a through cavity 41 in a trapezoid shape with a wider upper end and a narrower lower end. Lube oil may enter into the through cavity 41 and be carried by the up and down sliding rolling ball 42 into the arched trough 40. When the bottom end 30 of the air fan spindle 3 is coupled and held in the arched trough 40 of the support body 4, the air fan spindle may be anchored at a restricted position and rotation of the air fan spindle may become smoother.

What is claimed is:

1. A spindle positioning support structure, comprising;
   a support body located in a center opening of an air fan seat, the support body having an arched trough which has a profile same as a bottom end of an air fan spindle, the arched trough having a top end extending upwards to form arched latch lips with a slot formed between every two neighboring latch lips.

2. The spindle positioning support structure of claim 1, wherein the air fan seat has an inner bottom rim with a sensor located thereon.

3. The spindle positioning support structure of claim 1, wherein the arched trough has a bottom end which has a through cavity in a trapezoid shape with a wider upper end and a narrower lower end, the through cavity holding a rolling ball which is slidable up or down in the trapezoid shaped through cavity.

* * * * *